(12) United States Patent
Kim

(10) Patent No.: US 12,334,132 B2
(45) Date of Patent: Jun. 17, 2025

(54) MEMORY DEVICE AND METHOD FOR CONTROLLING ROW HAMMER

(71) Applicant: Samsung Electronics Co., Ltd., Suwon-si (KR)

(72) Inventor: Ho-Youn Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/607,520

(22) Filed: Mar. 17, 2024

(65) Prior Publication Data

US 2024/0221815 A1 Jul. 4, 2024

Related U.S. Application Data

(63) Continuation of application No. 17/871,917, filed on Jul. 23, 2022, now Pat. No. 11,961,548.

(30) Foreign Application Priority Data

Sep. 24, 2021 (KR) .................. 10-2021-0126722

(51) Int. Cl.
*G11C 11/406* (2006.01)
*G11C 7/10* (2006.01)

(52) U.S. Cl.
CPC ...... *G11C 11/40615* (2013.01); *G11C 7/1036* (2013.01); *G11C 11/40622* (2013.01)

(58) Field of Classification Search
CPC ........ G11C 11/40615; G11C 11/40622; G11C 7/1036
See application file for complete search history.

(56) References Cited

U.S. PATENT DOCUMENTS

| | | | |
|---|---|---|---|
| 9,032,141 B2 | 5/2015 | Bains et al. | |
| 9,299,400 B2 | 3/2016 | Bains et al. | |
| 9,892,779 B2 * | 2/2018 | Kang | G11C 11/40618 |
| 9,972,377 B2 * | 5/2018 | Oh | G11C 11/406 |
| 10,032,501 B2 | 7/2018 | Ito et al. | |
| 10,534,686 B2 | 1/2020 | Mazumder et al. | |

(Continued)

FOREIGN PATENT DOCUMENTS

| | | |
|---|---|---|
| TW | 201801079 A | 1/2018 |
| TW | 202131324 A | 8/2021 |

OTHER PUBLICATIONS

US 10,964,374 B2, 03/2021, Jenkinson et al. (withdrawn)

*Primary Examiner* — Son L Mai
(74) *Attorney, Agent, or Firm* — Muir Patent Law, PLLC

(57) ABSTRACT

A row hammer control method and a memory device are provided. The memory device monitors the row hammer address(es) having the number of accesses equal to or more than a predetermined number of times or having a higher number of accesses as compared with other access addresses during the first row hammer monitoring time frame and malicious row hammer address(es) accessed at random sampling time points during the second row hammer monitoring time frame and being the same as the row hammer address(es), notifies a memory controller of the malicious row hammer address(es) when the number of malicious row hammer addresses exceeds a threshold value, and causes a target refresh a memory cell row physically adjacent to a memory cell row corresponding to the malicious row hammer address(es) to be performed.

18 Claims, 11 Drawing Sheets

(56) References Cited

U.S. PATENT DOCUMENTS

| | | |
|---|---|---|
| 10,614,873 B2 | 4/2020 | Lee et al. |
| 10,916,293 B1 | 2/2021 | Lai et al. |
| 10,964,378 B2 | 3/2021 | Ayyapureddi et al. |
| 12,119,044 B2 * | 10/2024 | Cho .................. G11C 11/40603 |
| 2020/0081631 A1 | 3/2020 | Schaefer et al. |
| 2023/0317133 A1 | 10/2023 | Cao et al. |
| 2023/0326511 A1 | 10/2023 | Oh |

* cited by examiner

MEMORY DEVICE AND METHOD FOR CONTROLLING ROW HAMMER

CROSS-REFERENCE TO RELATED APPLICATION(S)

This application is a Continuation of U.S. patent application Ser. No. 17/871,917 filed on Jul. 23, 2022, now Allowed, which claims priority under 35 U.S.C. § 119 to Korean Patent Application No. 10-2021-0126722, filed on Sep. 24, 2021, in the Korean Intellectual Property Office, the disclosure of which is incorporated by reference herein in its entirety.

BACKGROUND

The inventive concept relates to semiconductor memory devices, and more particularly, to a memory device for controlling row hammer with respect to memory cell(s) that are intensively accessed during a particular time period, and to a method of operating the same.

To store data or instructions used by a host in a system and/or to perform computational operations, the system using semiconductor chips widely uses dynamic random access memory (DRAM) as an operating memory or main memory of the system. In general, DRAM writes data or reads written data under the control of a host. When performing a computer operation, a host retrieves instructions and/or data from DRAM, executes the instructions, and/or uses the data to perform the computer operation. If the result of the computer operation exists, the host writes back the result of the computer operation to the DRAM.

DRAM cell sizes are decreasing to increase DRAM capacity and density. Some DRAM-based systems experience intermittent failure due to heavy workload. These failures are traced by repeated accesses to a single row of memory cells, so-called row hammer. Memory cells connected to a physically adjacent row of memory cells are disturbed by row hammer, and data corruption may be induced. Memory cells affected by row hammer may be refreshed by a target refresh operation.

To manage row hammer, the DRAM may monitor hammer address(es) that are intensively accessed among the access addresses for a preset time. The DRAM generates, based on the hammer address(es), hammer refresh address(es) indicating the address of the memory cell row(s) physically adjacent to the memory cell row(s) corresponding to the hammer address(es), and memory cells connected to the memory cell row corresponding to the hammer refresh address may be target-refreshed. The number of hammer address(es) may be determined by the number of historical accesses for a certain time period, and further, may be determined by the number of access registers storing the number of accesses.

For example, it is assumed that the number of access registers set to manage row hammer is three and a particular number of accesses of memory cell rows equal to or more than a threshold value that have been intensively accessed are sorted in the order of 13, 12, 11, and 10. Access addresses having the particular number of accesses of 13, 12 and 11 will be stored in three access registers and managed as hammer addresses. However, the access address with the particular number of accesses of 10 may be a malicious row hammer address that is intensively accessed at particular time points. In this case, even though the memory cell row is a row-hammer-risky row, the memory cell row with the maximum number of accesses of 10 is not included in the historical maximum number of accesses, and thus is not provided as a hammer address, so that there is an issue in that the target is not refreshed.

On the other hand, if the DRAM has many access registers to manage row hammer, it is possible to perform target refresh even for row-hammer-risky rows. However, a chip size overhead caused by an increase in access registers may act as a burden on the DRAM.

Accordingly, to detect the memory access environment that causes malicious row hammer, and to control row hammer and malicious row hammer, there is a need for a method capable of minimizing an area occupied by resources for a target refresh operation and improving target refresh efficiency.

SUMMARY

The inventive concept provides a memory device for controlling malicious row hammer for memory cell(s) receiving intensive access at particular time points, and a method of operating the same.

According to an aspect of the inventive concept, there is provided a memory device that includes a memory cell array including a plurality of memory cell rows. a control logic circuit configured to monitor access addresses for the memory cell array to detect a first hammer address and a second hammer address, and a refresh control circuit configured to refresh a memory cell row physically adjacent to a memory cell row corresponding to the first hammer address. The first hammer address includes a row hammer address of memory cell rows having the number of accesses equal to or more than a predetermined number of times or having a relatively higher number of accesses as compared with other access addresses during a first row hammer monitoring time frame. The second hammer address includes a malicious row hammer address of memory cell rows accessed at random sampling time points during a second row hammer monitoring time frame, and being the same as the row hammer address. The control logic circuit is configured to count the number of malicious row hammer addresses. The refresh control circuit is configured to refresh a memory cell row physically adjacent to a memory cell row corresponding to the malicious row hammer address when the counted number of malicious row hammer addresses exceeds a threshold value.

According to another aspect of the inventive concept, there is provided a memory device that includes a memory cell array including a plurality of memory cell rows, a control logic circuit configured to detect: a row hammer address of memory cell rows having the number of accesses equal to or more than a predetermined number of times or having a relatively higher number of accesses as compared with other access addresses during a first row hammer monitoring time frame, and a malicious row hammer address of memory cell rows accessed at random sampling time points during a second row hammer monitoring time frame and being the same as the row hammer address, and a refresh control circuit configured to refresh a memory cell row physically adjacent to a memory cell row corresponding to the row hammer address. The control logic circuit includes a first register configured to store random sampling addresses of memory cell rows accessed at the random sampling time points, and a comparator configured to compare the row hammer address with the random sampling addresses, and output the row hammer address as the malicious row hammer address when one of the random sampling addresses is identical to the row hammer address.

According to another aspect of the inventive concept, there is provided a method of operating a memory device including a plurality of memory cell rows. The method includes detecting a first hammer address and a second hammer address by monitoring the number of accesses of addresses for the memory cell rows, storing the first hammer address as a row hammer address of memory cell rows having the number of accesses equal to or more than a predetermined number of times or having a relatively higher number of accesses as compared with other access addresses during a first row hammer monitoring time frame, storing the second hammer address as a malicious row hammer address of memory cell rows accessed at random sampling time points during a second row hammer monitoring time frame, and being the same as the row hammer address, counting the number of malicious row hammer addresses, performing a refresh operation on a memory cell row physically adjacent to a memory cell row corresponding to the row hammer addresses, and performing a refresh operation on a memory cell row physically adjacent to a memory cell row corresponding to the malicious row hammer address when the counted number of malicious row hammer addresses exceeds a threshold value.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
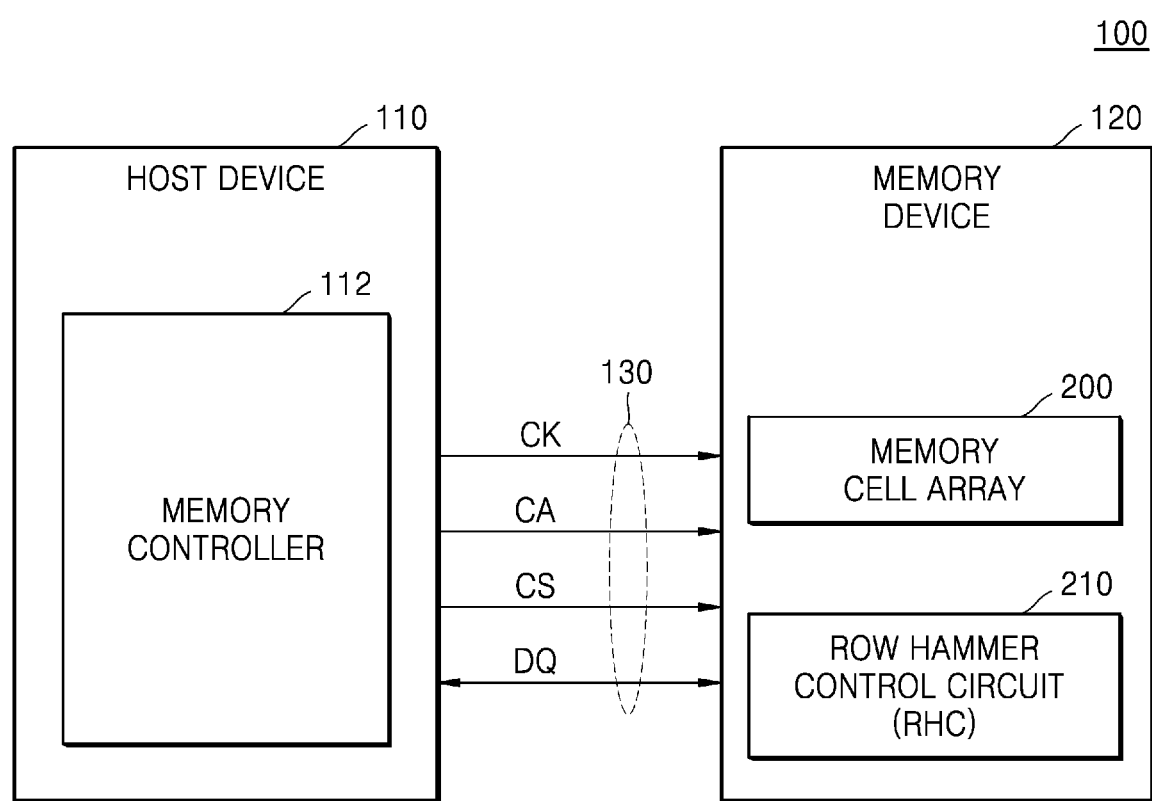
FIG. 1 is a diagram illustrating a system including a memory device for controlling row hammer according to example embodiments of the inventive concept.

FIG. 1 is a diagram illustrating a system including a memory device for controlling row hammer according to example embodiments of the inventive concept.

Referring to FIG. 1, a system (or a memory system) 100 may include a host device 110 and a memory device 120. The host device 110 may be communicatively connected to the memory device 120 through a memory bus 130.

The system 100 may be, for example, a computing system such as a computer, a notebook computer, a server, a workstation, a portable communication terminal, a personal digital assistant (PDA), a portable multimedia player (PMP), a smartphone, or a wearable device. The host device 110 may be a part of components included in a computing system such as a graphics card.

As a functional block for performing general computer operations in the system 100, the host device 110 may correspond to a central processing unit (CPU), a digital signal processor (DSP), a graphics processing unit (GPU), or an application processor (AP). The host device 110 may include a memory controller 112 that manages data transmission/reception to/from the memory device 120.

The memory controller 112 may access the memory device 120 according to a memory request from the host device 110. The memory controller 112 may include a memory physical layer interface for interfacing with the memory device 120, such as selecting rows and columns corresponding to a memory location, writing data to a memory location, or reading written data. Commonly, the memory physical layer interface 114 is referred to as a memory PHY 114.

The memory controller 112 may control a write operation or a read operation with respect to the memory device 120 by providing a command CMD and an address ADDR to the memory device 120. Also, data DQ for a write operation and read data DQ may be transmitted/received between the memory controller 112 and the memory device 120. The memory access operation may be performed through the memory PHY and the memory bus 130 between the memory controller 112 and the memory device 120. The memory PHY 114 may include a physical or electrical layer and a logical layer provided for signals, frequency, timing, driving, detailed operating parameters, and functionality required for efficient communication between the memory controller 112 and the memory device 120. The memory PHY 114 may support features of DDR (Double Data Rate) and/or LPDDR (Low-Power DDR) protocol of the JEDEC (Joint Electron Device Engineering Council) standard.

The memory controller 112 and the memory device 120 may be connected through the memory bus 130. For the conciseness of the drawing, although it is shown that a clock CK signal, a command/address CA signal, a chip select CS signal, and the data DQ are provided from the memory bus 130 through one signal line between the memory controller 112 and the memory device 120, in practice, the clock CK, the command/address CA, the chip select CS, and the data DQ may be provided through a plurality of signal lines or a bus. Signal lines between the memory controller 112 and the memory device 120 may be connected through connectors. Connectors may be implemented as pins, balls, signal lines, or other hardware components.

The clock CK signal may be transmitted from the memory controller 112 to the memory device 120 through a clock signal line of the memory bus 130. The command/address CA signal may be transmitted from the memory controller 112 to the memory device 120 through a command/address CA bus of the memory bus 130. The chip select CS signal may be transmitted from the memory controller 112 to the memory device 120 through a chip select CS line of the memory bus 130. A signal transmitted through the command/address CA bus in a state in which the chip select CS signal is activated to be logic high may indicate that the signal is a command. The data DQ may be transmitted from the memory controller 112 to the memory device 120 or from the memory device 120 to the memory controller 112 through the data DQ bus of the memory bus 130 including bidirectional signal lines.

The memory device 120 may write data DQ or read data DQ, and perform a refresh operation under the control by the memory controller 112. For example, the memory device 120 may be a double data rate synchronous dynamic random access memory (DDR SDRAM) device. However, the scope of the inventive concept is not limited thereto, and the memory device 120 may be any one of volatile memory devices such as LPDDR SDRAM, wide I/O DRAM, high bandwidth memory (HBM), hybrid memory cube (HMC), and the like. The memory device 120 may include a memory cell array 200 and a row hammer control circuit 210.

The memory cell array 200 may include a plurality of word lines and a plurality of bit lines, and a plurality of memory cells formed at intersections of the word lines and the bit lines. A memory cell of the memory cell array 200 may be a volatile memory cell, for example, a DRAM cell.

The row hammer control circuit 210 may detect first hammer address(es) and second hammer address(es) that are intensively accessed from among the access addresses for the memory cell array 200. Herein, the terms "intensively accessed" may mean that an address corresponding to a particular word line is accessed equal to or more than a predetermined number of times or relatively higher accessed as compared with other addresses within a time period. According to an embodiment, the row hammer control circuit 210 may count the number of accesses of addresses corresponding to rows of the memory cell array 200 during the row hammer monitoring time frame, sort the counted number of accesses of addresses, store some of the addresses of the sorted number of accesses in the first register, and set the some of the addresses as the first hammer address(es). The row hammer control circuit 210 may provide random sampling time points to count the number of accesses of addresses at particular time points during the row hammer monitoring time frame. The row hammer control circuit 210 may count the number of accesses of addresses corresponding to rows of the memory cell array 200 at random sampling time points, store the counted access addresses in a second register, and set the stored counted access addresses as the second hammer address(es). The row hammer control circuit 210 may compare the second hammer addresses with the first hammer addresses, and as a result of the comparison, store the same hammer address(es) in the second register, and set the stored same hammer address(es) as malicious row hammer address(es). The row hammer control circuit 210 may be configured to inform the memory controller 112 of the malicious row hammer address(es) to cause a target refresh to the malicious row hammer address(es) to be performed. Accordingly, the row hammer control circuit 210 may alleviate the row hammer of the memory device 120.

Figure 2:
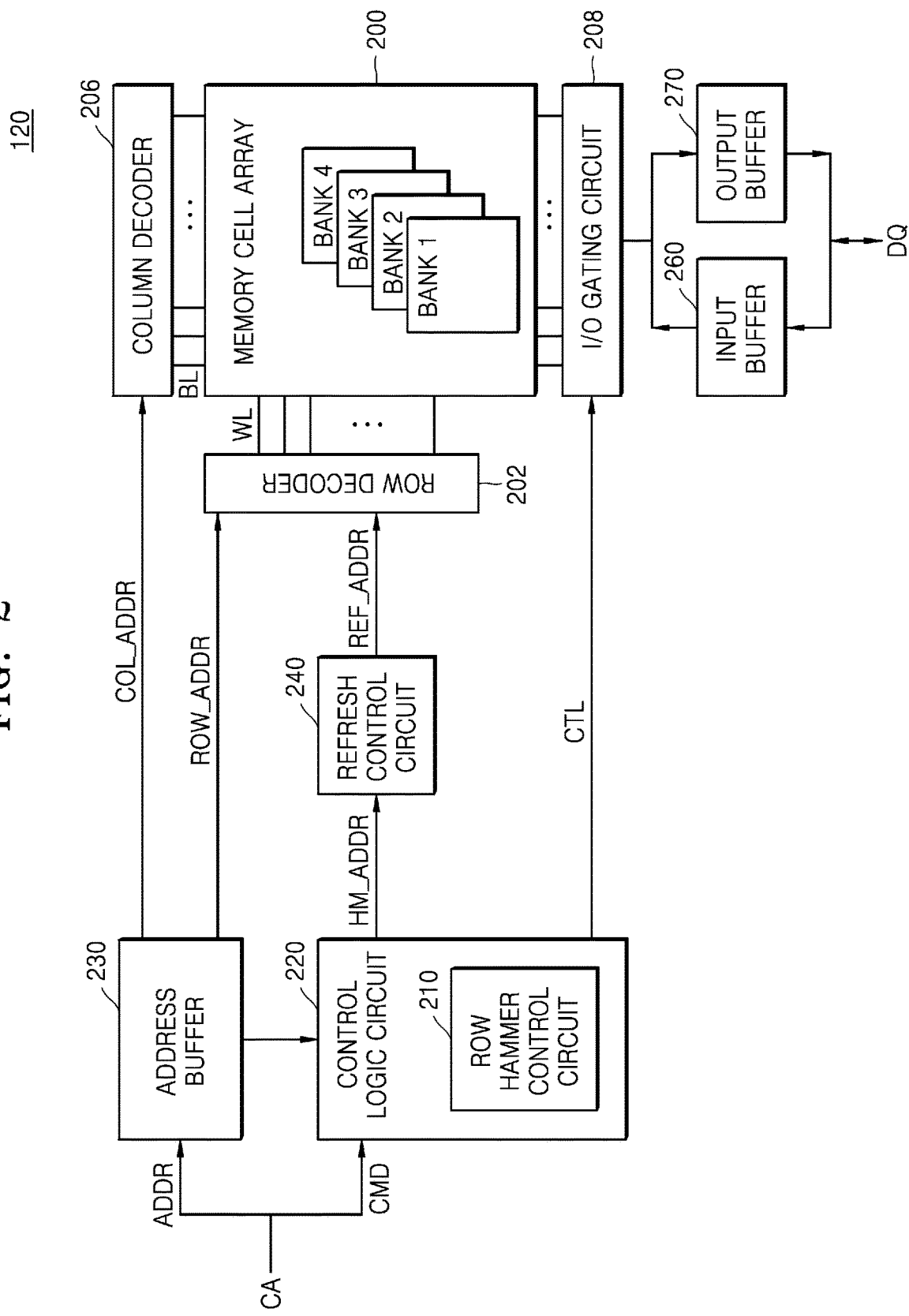
FIG. 2 is a block diagram illustrating a memory device according to embodiments of the inventive concept.

FIG. 2 is a block diagram illustrating a memory device according to embodiments of the inventive concept. FIG. 2 shows the memory device 120 of FIG. 1 implemented with DRAM. It should be noted that the DRAM configuration shown in FIG. 2 is provided as an example and is not necessarily an actual DRAM configuration. Furthermore, the present disclosure is not limited to the DRAM configuration shown in FIG. 2 as an example.

Referring to FIGS. 1 and 2, the memory device 120 may include the memory cell array 200, a row decoder 202, a column decoder 206, an input/output (I/O) gating circuit 208, a control logic circuit 220, an address buffer 230, a refresh control circuit 240, an input buffer 260, and an output buffer 270. Although not shown in FIG. 2, the memory device 120 may further include a clock buffer, a mode register set (MRS), a bank control logic, a voltage generating circuit, and the like.

The address buffer 230 may receive an address ADDR including a bank address, a row address ROW_ADDR, and a column address COL_ADDR from the memory controller 112. The address buffer 230 may provide the received bank address to the bank control logic, provide the received row address ROW_ADDR to the row decoder 202, and provide the received column address COL_ADDR to the column decoder 206.

The memory cell array 200 includes a plurality of memory cells provided in a matrix form arranged in rows and columns. The memory cell array 200 includes a plurality of word lines WL and a plurality of bit lines BL connected to the memory cells. The plurality of word lines WL may be connected to rows of memory cells, and the plurality of bit lines BL may be connected to columns of memory cells. Data of memory cells connected to an activated word line WL from among the plurality of word lines WL may be sensed and amplified by sense amplifiers connected to the bit lines BL.

The memory cell array 200 may include first to fourth banks BANK1 to BANK4. The bank control logic generates bank control signals in response to the bank address, and the row decoder 202 and the column decoder 206 of a bank corresponding to a bank address from among the first to fourth banks BANK1 to BANK4 may be activated in response to the bank control signals. Although the present embodiment shows an example of the memory device 120 including four banks, the memory device 120 may include any number of banks depending on the embodiment.

The row decoder 202 and the column decoder 206 may be arranged to correspond to each of the first to fourth banks BANK1 to BANK4, and the row decoder 202 and the column decoder 206 connected to the bank corresponding to the bank address may be activated. Although not shown in FIG. 2, the row decoder 202 may include four bank row decoders to control a corresponding bank of the first to fourth banks BANK1 to BANK4. The row decoder 202 may decode the row address ROW_ADDR received from the address buffer 230 to select a word line WL corresponding to the row address ROW_ADDR from among the plurality of word lines WL, and connect to a word line driver that activates the selected word line WL.

The column decoder 206 may select set bit lines BL from among a plurality of bit lines BL of the memory cell array 200. Although not shown in FIG. 2, the column decoder 206 may include four bank column decoders to control a corresponding bank of the first to fourth banks BANK1 to BANK4. The column decoder 206 may generate a column selection signal by decoding a burst address that is gradually increased by one based on the column address COL_ADDR in the burst mode, and connect the bit lines BL selected by the column selection signal to the I/O gating circuit 208. Burst addresses refer to addresses of column locations that may be accessed in terms of burst length BL for read and/or write commands.

The I/O gating circuit 208 may include read data latches for storing read data of the bit lines BL selected by the column select signal, and a write driver for writing write data into the memory cell array 200. The read data stored in the read data latches of the I/O gating circuit 208 may be provided to the data DQ bus through the output buffer 270. Write data may be applied to the memory cell array 200 through the input buffer 260 connected to the data DQ bus and through the write driver of the I/O gating circuit 208.

The control logic circuit 220 may receive the clock CK signal and the command CMD and may generate control signals CTL for controlling an operation timing and/or a memory operation of the memory device 120. The control logic circuit 220 may provide control signals to circuits of the memory device 120 to operate as set in the operation and control parameters stored by the MRS. The control logic circuit 220 may read data from the memory cell array 200 and write data to the memory cell array 200 using the control signals CTL. Although the control logic circuit 220 and the address buffer 230 are illustrated as separate components in FIG. 2, the control logic circuit 220 and the address buffer 230 may be implemented as one inseparable component. In addition, although it is illustrated in FIG. 2 that the command CMD and the address ADDR are provided as separate signals, respectively, an address may be considered to be included in a command as presented in the LPDDR standard or the like.

The control logic circuit 220 may be configured to detect the row hammer address(es) that are intensively accessed during the row hammer monitoring time frame, and target-refresh a row of memory cells physically adjacent to a row of memory cells corresponding to the row hammer address. In addition, the control logic circuit 220 may be configured to detect malicious row hammer address(es) that are accessed at random sampling time points and intensively accessed during the row hammer monitoring time frame, alert the malicious row hammer by transmitting information on the malicious row hammer address(es) to the memory controller 112, and target-refresh a row of memory cells physically adjacent to a row of memory cells corresponding to the malicious row hammer address(es). According to an embodiment, the control logic circuit 220 may transmit information on the malicious row hammer address(es) to the memory controller 112 through a data DQ bus of the memory bus 130 or through a signal line dedicated to notification.

The control logic circuit 220 may include the row hammer control circuit 210 that detects malicious row hammer address(es) during the row hammer monitoring time frame. The row hammer control circuit 210 will be described later with reference to FIG. 3. In the following embodiment, it is described that the row hammer control circuit 210 controls the malicious row hammer, but embodiments of the inventive concept are not limited thereto. For example, it may be described that the row hammer control circuit 210 corresponds to a configuration provided in the control logic circuit 220, and the control logic circuit 220 controls the malicious row hammer.

The control logic circuit 220 may control the refresh control circuit 240 to perform a normal refresh operation by increasing the refresh counter value by one in response to the refresh command CMD. Also, the control logic circuit 220 may control the refresh control circuit 240 to perform a target refresh operation based on hammer address(es) HM_ADDR including row hammer address(es) and malicious row hammer address(es). The refresh control circuit 240 may generate a refresh address REF_ADDR corresponding to a memory cell row on which a normal refresh operation and/or a target refresh operation are/is to be performed.

Figure 3:
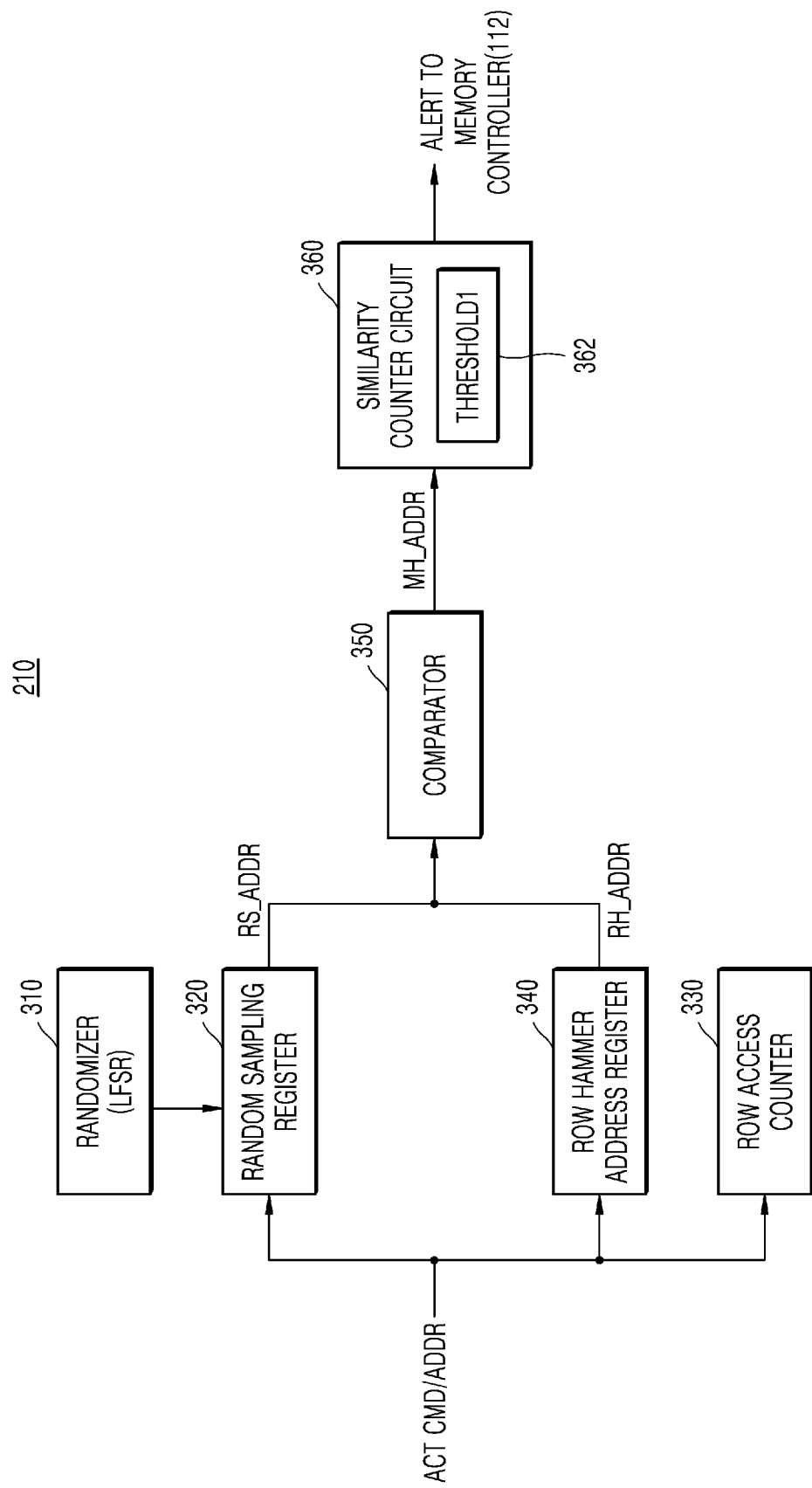
FIG. 3 is a block diagram illustrating a row hammer control circuit according to embodiments of the inventive concept.
Figure 4:
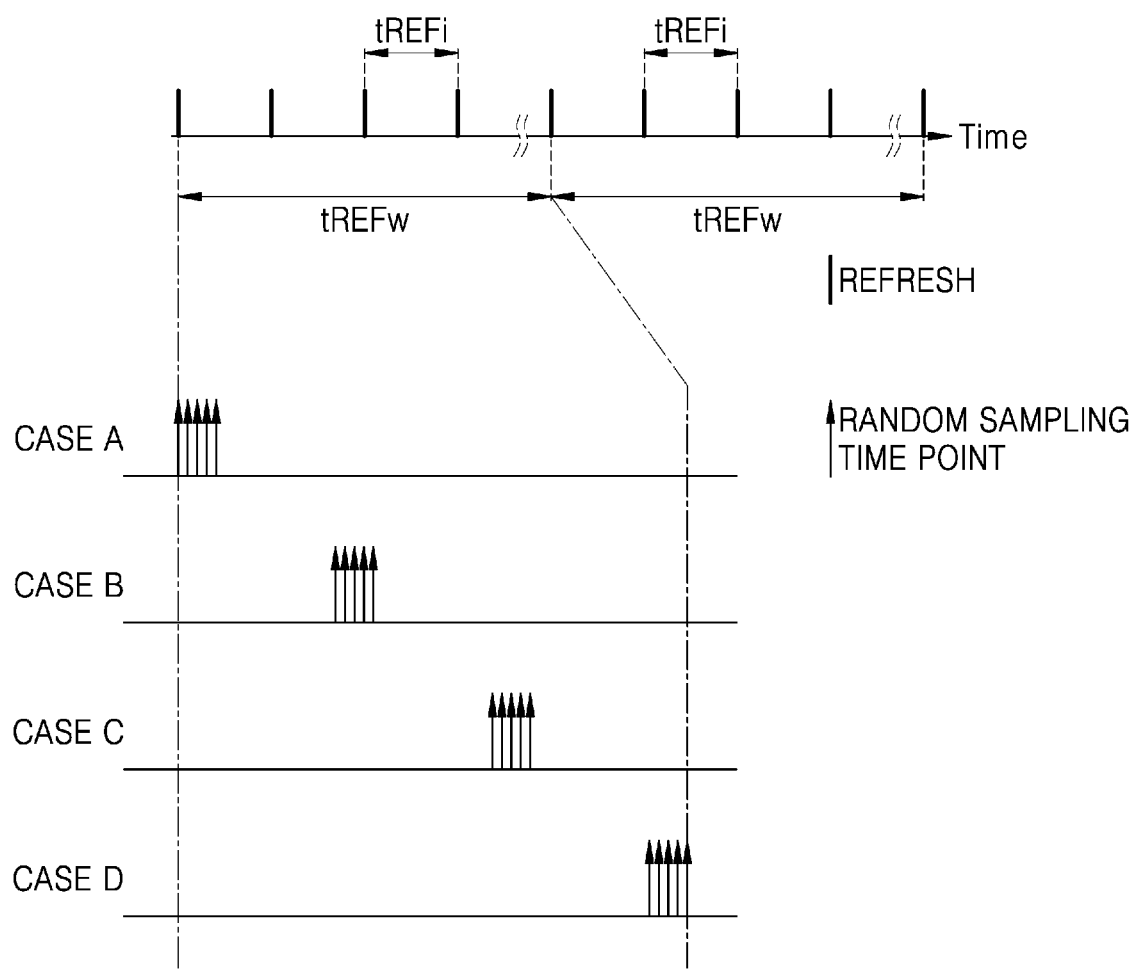
FIGS. 4 and 5 are diagrams illustrating random sampling time points implemented by a randomizer in the row hammer control circuit of FIG. 3.
Figure 5:
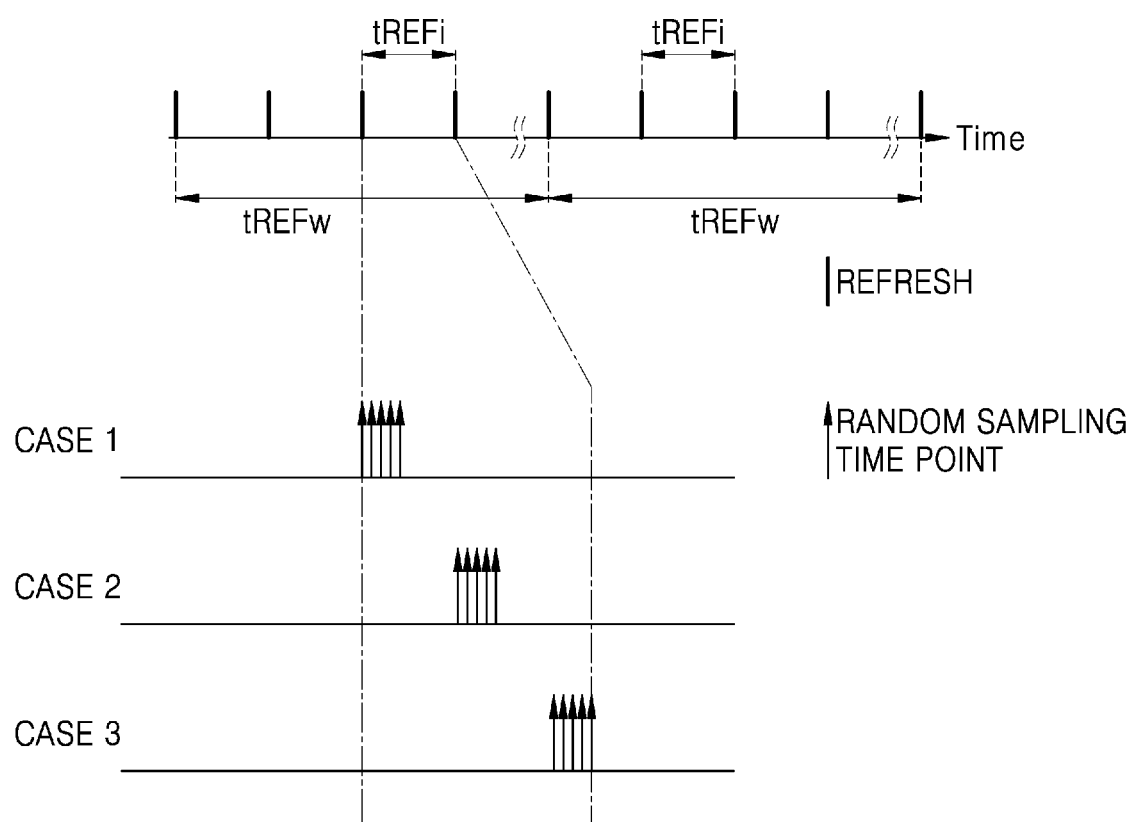
Figure 6:
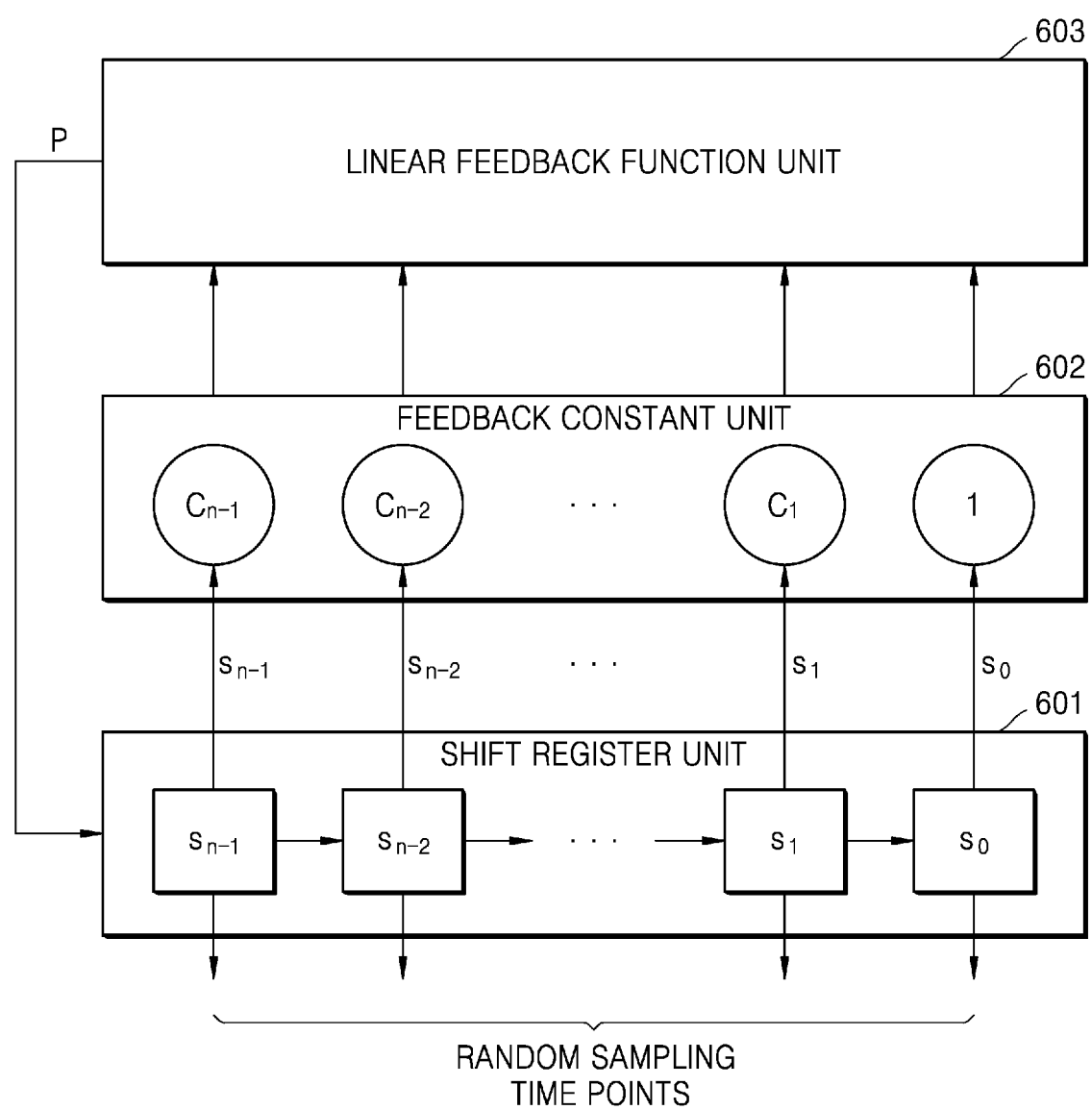
FIGS. 6 and 7 are diagrams conceptually explaining the operation of the row hammer control circuit of FIG. 3.
Figure 7:
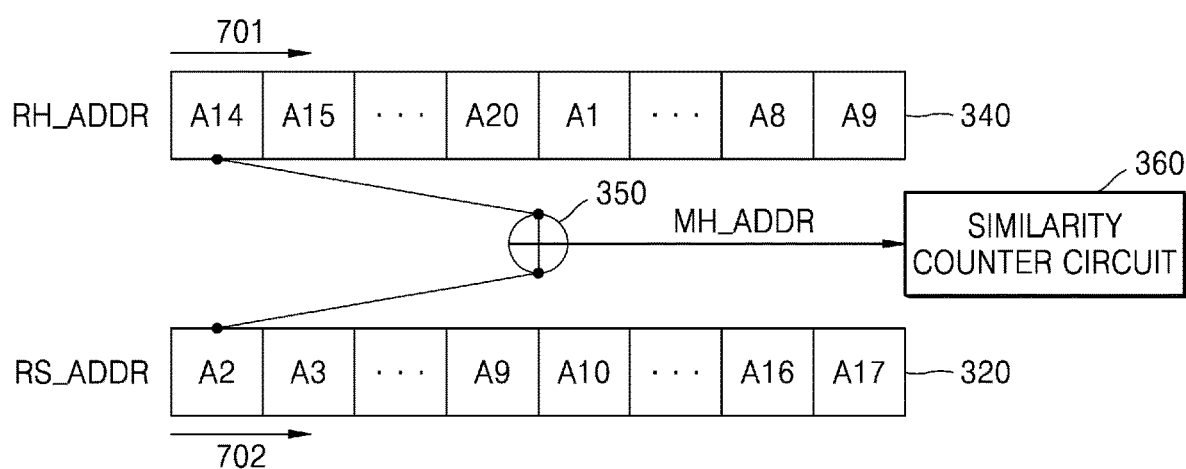

FIG. 3 is a block diagram illustrating a row hammer control circuit according to embodiments of the inventive concept. FIGS. 4 and 5 are diagrams illustrating random sampling time points implemented by a randomizer in the row hammer control circuit of FIG. 3. FIGS. 6 and 7 are diagrams conceptually explaining the operation of the row hammer control circuit of FIG. 3. Hereinafter, the row hammer control circuit collectively refers to what is implemented in hardware, firmware, software, or a combination thereof for controlling or managing row hammer.

Referring to FIGS. 2 and 3, the row hammer control circuit 210 may be configured to monitor row hammer for one or more rows of memory cells within the memory cell array 200 and to detect a type of row hammer of a particular row of memory cells. The particular memory cell row refers to a memory cell row having the number of accesses equal to or more than a predetermined number of times or having a relatively higher number of accesses as compared with other addresses during a set time period. In some examples, the particular memory cell row refers to a memory cell row having the number of active commands equal to or more than a predetermined number of times or having a relatively higher number of active commands as compared with other memory cell rows during a set time period. As shown in FIG. 4, the set time period may be set to a 32 ms or 64 ms as a refresh window tREFw defined in the JEDEC standard. The memory controller 112 may issue refresh commands at appropriate times. The fundamental requirement is that each memory cell of the memory cell array 200 may be refreshed or accessed at least once within its retention period such as the refresh window tREFw. According to an embodiment, the set time period may be set as a refresh time interval tREFi as shown in FIG. 5. The refresh time interval tREFi is the actual time interval between two refresh operations and is determined by the system 100. The refresh time interval tREFi is the time interval between two refresh commands REFRESH. The refresh time interval tREFi is defined as, for example, the number of refresh commands REFRESH on the order of 8K within a 32 ms refresh window. Hereinafter, the set time period may be referred to as a row hammer monitoring time frame or time window set by the control logic circuit 220.

The row hammer control circuit 210 may detect malicious row hammer address(es) that are accessed at particular time points and intensively accessed during the row hammer monitoring time frame. The row hammer control circuit 210 includes a randomizer 310, a random sampling register 320, a row access counter 330, a row hammer address register 340, a comparator 350, and a similarity counter circuit 360.

The randomizer 310 may be configured to randomly provide row hammer sampling time points during the row hammer monitoring time frame. The randomizer 310 may include a linear feedback shift register (LFSR) that generates and outputs a linear random number sequence based on a primitive polynomial. The LFSR may include a shift register unit 601, a feedback constant unit 602, and a linear feedback function unit 603 as shown in FIG. 6.

Referring to FIG. 6, the shift register unit 601 includes n shift registers $S_0, S_1, \ldots,$ and $S_{n-1}$, and the shift registers $S_0, S_1, \ldots,$ and $S_{n-1}$ may receive and shift an output P of the linear feedback function unit 603 and output the outputs $s_0, s_1, \ldots,$ and $s_{n-1}$ of each stage of the shift registers $S_0, S_1, \ldots,$ and $S_{n-1}$ to each stage of the feedback constant unit 602 on a one-to-one basis.

The feedback constant unit 602 is a coefficient of a primitive polynomial, and takes values of modes 0 and 1, and is a value of $C_i$ ($C_0=1$, i=1, 2, ..., and n−1) indicating the connection state with the shift register unit 601. The feedback constant unit 602 may receive the outputs $s_0, s_1, \ldots,$ and $s_{n-1}$ of the shift register unit 601 and output the received outputs $s_0, s_1, \ldots,$ and $s_{n-1}$ to the linear feedback function unit 603 together with its constant value $C_i$ ($C_0=1$, i=1, 2, ..., and n−1).

The linear feedback function unit 603 receives outputs of the feedback constant unit 602 that are the outputs $s_0,$ $s_1, \ldots,$ and $s_{n-1}$ of the shift register 601 of each stage with its constant value $C_i$ ($C_0=1$, i=1, 2, ..., and n−1) and generates the output P by Equation 1 to output the generated output P to the shift register unit 601.

$$P = s_0 + C_1 s_1 + \ldots + C_{n-1} s_{n-1} \qquad \text{[Equation 1]}$$

The operation process of the LFSR is as follows. The linear feedback function unit 603 calculates and outputs the output P. Thereafter, the shift register unit 601 outputs all bits $s_0, s_1, \ldots,$ and $s_{n-1}$, and receives and shifts the output P of the linear feedback function unit 603. The outputs $s_0$, $s_1, \ldots,$ and $s_{n-1}$ of the shift registers $S_0, S_1, \ldots,$ and $S_{n-1}$ are output to the feedback constant unit 602. All bits $s_0$, $s_1, \ldots,$ and $s_{n-1}$ of the shift register unit 601 that are output whenever this operation process is repeatedly performed may be output as random values.

Returning to FIG. 3, the row hammer control circuit 210 may use the output of the randomizer 310 indicated by the random output value of the shift register unit 601 of FIG. 6 as a random sampling time point for monitoring the row hammer. Whenever a random output value of the randomizer 310 is output, a random sampling time point may be randomly determined.

Illustratively, as shown in FIG. 4, random sampling time points may appear to be concentrated in the first half CASE A, the first middle CASE B, the second middle CASE C, or the second half CASE D of the row hammer monitoring time frame (e.g., tREFw). However, the random sampling time point is not limited thereto, and may appear concentrated during an arbitrary time period within the tREFw time frame.

Illustratively, as shown in FIG. 5, random sampling time points may appear to be concentrated in the first half CASE 1, the first middle CASE 2, or the second half CASE 3 of the row hammer monitoring time frame (e.g., tREFi). However, the random sampling time point is not limited thereto, and may appear concentrated during an arbitrary time period within the tREFi time frame.

In FIG. 3, the random sampling register 320 may store addresses accessed at the random sampling time points of FIG. 4 or 5. The address(es) stored in the random sampling register 320 may be referred to as random sampling address(es) RS_ADDR.

The row access counter 330 may count the number of accesses of the address(es) accessed during the row hammer monitoring time frame. Among the number of accesses, the row access counter 330 may select a particular number of accesses equal to or more than a predetermined number of times or select a relatively higher number of accesses as compared with other access addresses, and store the selected addresses having the number of accesses equal to or more than the predetermined number of times or having the relatively higher number of accesses as compared with other access addresses in the row hammer address register 340.

In example embodiments, among the access addresses selected by the row access counter 330, some upper-order access address(es) may be stored in the row hammer address register 340 including a plurality of registers of limited resources. The access address(es) stored in the row hammer address register 340 may be referred to as row hammer address(es) RH_ADDR. The row hammer address(es) RH_ADDR stored in the row hammer address register 340 means the access address(es) determined by the number of historical accesses during the row hammer monitoring time frame, and may be limited in number.

The comparator 350 may compare the random sampling address(es) RS_ADDR stored in the random sampling register 320 with the row hammer address(es) RH_ADDR stored in the row hammer address register 340. The comparator 350 may determine whether the random sampling address(es) RS_ADDR is the same as the row hammer address(es) RH_ADDR, as shown in FIG. 7, and provide the determination result to the similarity counter circuit 360. For example, the comparator 350 may provide the malicious row hammer address MH_ADDR to the similarity counter circuit 360 when the comparator 350 is determined that the random sampling address RS_ADDR is the same as the row hammer address RH_ADDR.

Illustratively, in FIG. 7, it is assumed that the row hammer address(es) RH_ADDR having the number of accesses equal to or more than the predetermined number of times or having a relatively higher number of accesses as compared with other access addresses are stored in the selected order in the row hammer address register 340, for example, A14, A15, ..., A20, A1, ..., A8, and A9. In addition, it is assumed that the random sampling addresses RS_ADDR are sequentially stored in the random sampling register 320, for example, A2, A3, ..., A9, A10, ..., A16, and A17. The comparator 350 compares the random sampling address RS_ADDR A2 to the row hammer address(es) RH_ADDR A14, A15, ..., A20, A1, ..., A8, and A9 elementwise to determine whether they are the same.

For example, after comparing the row hammer address RH_ADDR A14 with the random sampling address RS_ADDR A2, the comparator 350 switches the row hammer address register 340 in a first direction 701, and performs the operation of sequentially comparing the row hammer addresses RH_ADDR A15, ..., A20, A1, ..., A8, and A9 to determine whether they are the same. After comparing the random sampling address RS_ADDR A2 to the row hammer addresses RH_ADDR A14, A15, ..., A20, A1, ..., A8, and A9, the comparator 350 switches the random sampling register 320 in a second direction 702 and performs the operation of comparing the random sampling address RS_ADDR A3 with the row hammer addresses RH_ADDR A14, A15, ..., A20, A1, ..., A8, and A9 to determine whether they are the same. The random sampling address RS_ADDR determined to be the same as the row hammer address RH_ADDR by the elementwise comparison operation of the comparator 350 may be provided to the similarity counter circuit 360. The random sampling address RS_ADDR equal to the row hammer address RH_ADDR may be referred to as a malicious row hammer address MH_ADDR that is accessed at random sampling time points and being accessed with the number of accesses equal to or more than the predetermined number of times or a relatively higher number of accesses as compared with other addresses during the row hammer monitoring time frame.

Referring to FIG. 3 again, the similarity counter circuit 360 may count the number of malicious row hammer address(es) MH_ADDR provided from the comparator 350, and compare the counted value with a threshold value THRESHOLD1. The similarity counter circuit 360 may include a register 362 that stores a threshold value THRESHOLD1. The similarity counter circuit 360 may notify the memory controller 112 of the number of malicious row hammer address(es) MH_ADDR exceeding the threshold value THRESHOLD1. Also, the similarity counter circuit 360 may provide the malicious row hammer address(es) MH_ADDR if the number of counted malicious row hammer address(es) MH_ADDR exceeds the threshold value THRESHOLD1. The memory controller 112 may control to perform a target refresh operation on the malicious row hammer address(es) MH_ADDR based on information of the malicious row hammer address(es) MH_ADDR.

Figure 8A:
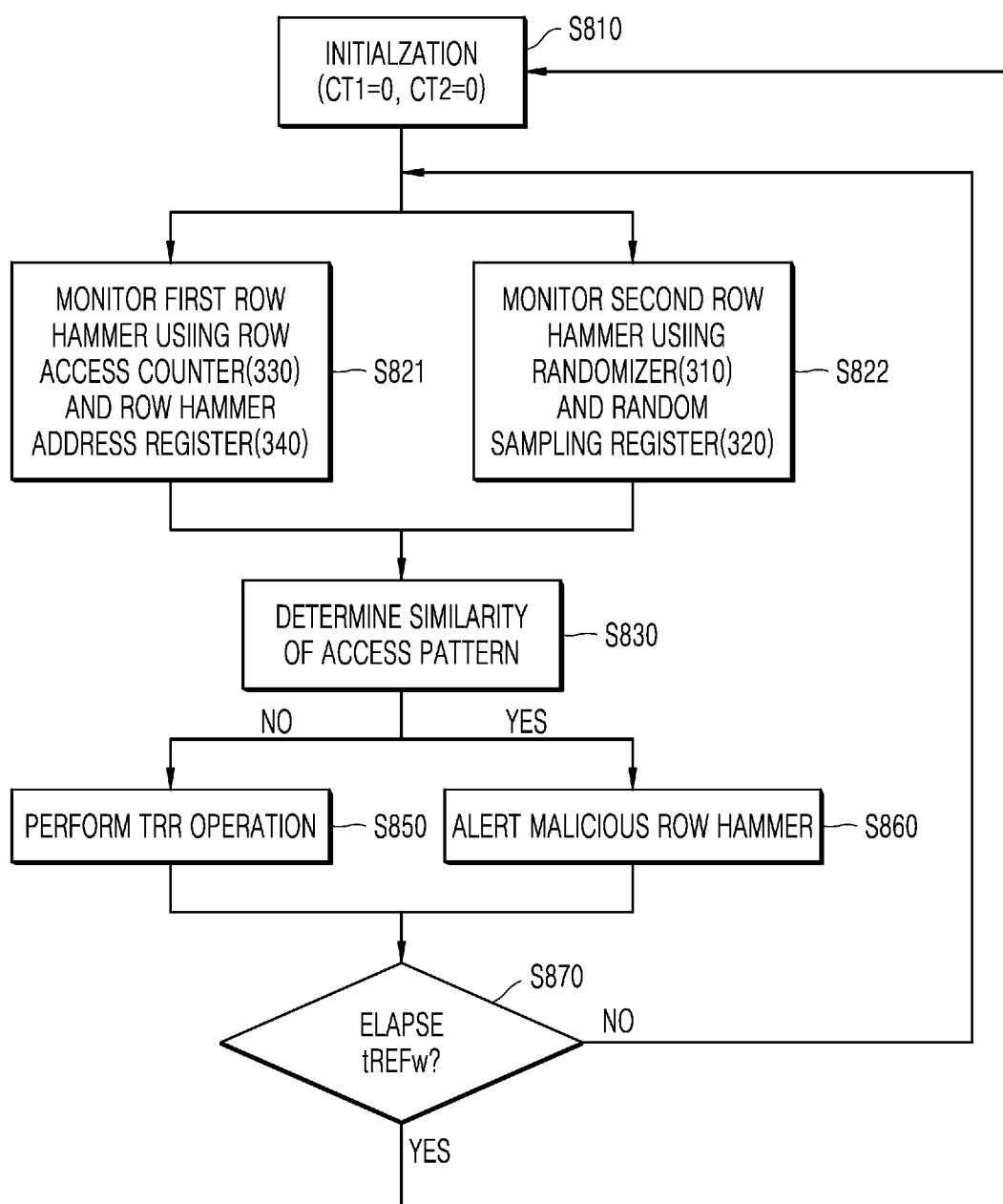
FIGS. 8A and 8B are flow diagrams illustrating an operation of a control logic circuit according to embodiments of the inventive concept.
Figure 8B:
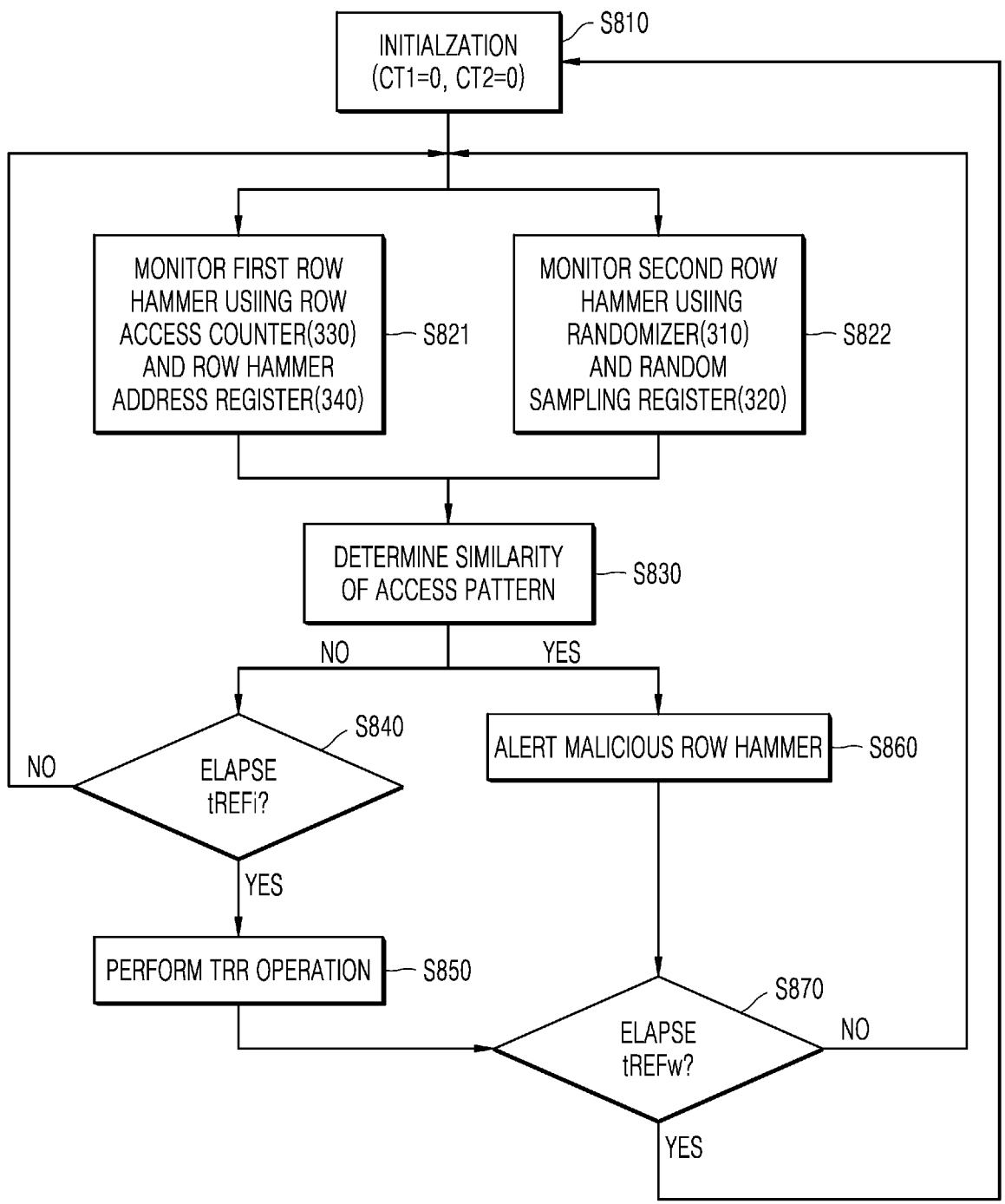

FIGS. 8A and 8B are flow diagrams illustrating an operation of a control logic circuit according to embodiments of the inventive concept. FIG. 8A illustrates an example in which the first row hammer monitoring time frame for monitoring the row hammer address(es) and the second row hammer monitoring time frame for monitoring the malicious row hammer address(es) are set equal to tREFw. FIG. 8B explains an example in which the first row hammer monitoring time frame and the second row hammer monitoring time frame are set differently to tREFw and tREFi, and explains an example in which the second row hammer monitoring time frame tREFi is set shorter than the first row hammer monitoring time frame tREFw.

Referring to FIG. 8A in conjunction with FIGS. 1 to 7, the system 100 may perform initialization in operation S810. When the system 100 is powered up, the memory controller 112 and the memory device 120 may perform an initial setting operation according to a set method. Default operation parameters may be set in initialization of the memory device 120. For example, the first count value CT1 of the row access counter 330 and the second count value CT2 of the similarity counter circuit 360 may be reset to "0". In addition, in the initialization of the memory device 120, a supplier or user of the system 100 may set a row hammer monitoring time frame, and may set the threshold value THRESHOLD1, which is a criterion for determining malicious row hammer.

In operations S821 and S822, the control logic circuit 220 may perform operation S821 of monitoring the first row hammer and operation S822 of monitoring the second row hammer in parallel.

In operation S821 of monitoring the first row hammer, the control logic circuit 220 may store, in the row hammer address register 340, the row hammer address(es) RH_ADDR selected by the row access counter 330 which counts the number of times of access of the address(es) accessed during the row hammer monitoring time frame tREFw.

In operation S822 of monitoring the second row hammer, the control logic circuit 220 may store, in the random sampling register 320, the random sampling address(es) RS_ADDR accessed at random sampling time points set by the randomizer 310 during the row hammer monitoring time frame tREFw.

In operation S830, the control logic circuit 220 may determine the similarity of the access pattern between the random sampling address(es) RS_ADDR obtained in operation S822 and the row hammer address(es) RH_ADDR obtained in operation S821. The control logic circuit 220 may determine the random sampling address RS_ADDR, which is determined to be the same as the row hammer address RH_ADDR, as a similar access pattern using the comparator 350 elementwise comparing the random sampling address(es) RS_ADDR with the row hammer address(es) RH_ADDR. Similar access patterns may appear as malicious row hammer address(es) MH_ADDR accessed at random sampling time points and being accessed with the number of accesses equal to or more than the predetermined number of times or a relatively higher number of accesses as compared with other addresses during the row hammer monitoring time frame tREFw.

If the control logic circuit 220 is determined that there is no similarity of the access pattern between the random sampling address(es) RS_ADDR and the row hammer address(es) RH_ADDR (NO), in operation S850, the control logic circuit 220 may perform a target refresh operation on the row hammer address(es) RH_ADDR obtained in operation S821.

If the control logic circuit 220 is determined that there is similarity of the access pattern between the random sampling address(es) RS_ADDR and the row hammer address(es) RH_ADDR (YES), in operation S860, the control logic circuit 220 may transmit information on the malicious row hammer address(es) MH_ADDR to the memory controller 112 to inform the malicious row hammer. Also, in operation S860, the control logic circuit 220 may perform a target refresh operation on the malicious row hammer address(es) MH_ADDR obtained in operation S821, S822, and S830.

The control logic circuit 220 performs a target refresh operation S850 on the row hammer address(es) RH_ADDR obtained in operation S821 and a target refresh operation S860 on the malicious row hammer address(es) MH_ADDR obtained in operations S821, S822 and S830, and proceeds to operation S870.

The control logic circuit 220 may transmit information on the malicious row hammer address(es) MH_ADDR obtained in operations S821, S822 and S830 to the memory controller 112 to notify the malicious row hammer in operation S860, and proceed to operation S870.

In operation S870, the control logic circuit 220 may determine whether the row hammer monitoring time frame tREFw has elapsed. If the row hammer monitoring time frame tREFw has not elapsed (NO), the control logic circuit 220 may proceed to operations S821 and S822. The control logic circuit 220 may repeatedly perform the row hammer monitoring operation on the row hammer address(es) RH_ADDR and the malicious row hammer address(es) MH_ADDR to be obtained in operations S821, S822, and S830. When the row hammer monitoring time frame tREFw has elapsed (YES), the control logic circuit 220 may proceed to operation S810 to initialize the memory device 120. In this case, the first count value CT1 of the row access counter 330 and the second count value CT2 of the similarity counter circuit 360 may be reset to "0".

Referring to FIG. 8B in conjunction with FIGS. 1 to 7, the system 100 may perform initialization in operation S810. The first count value CT1 of the row access counter 330 and the second count value CT2 of the similarity counter circuit 360 are reset to "0". In addition, in the initialization of the memory device 120, a supplier or user of the system 100 may set a first row hammer monitoring time frame to tREFw, a second row hammer monitoring time frame to tREFi, and the threshold value THRESHOLD1, which is a criterion for determining malicious row hammer.

In operations S821 and S822, the control logic circuit 220 may perform operation S821 of monitoring the first row hammer and an operation S822 of monitoring the second row hammer in parallel. In operation S821 of monitoring the first row hammer, the control logic circuit 220 may store, in the row hammer address register 340, the row hammer address(es) RH_ADDR selected by the row access counter 330 which counts the number of times of access of the address(es) accessed during the first row hammer monitoring time frame tREFw. In operation S822 of monitoring the second row hammer, the control logic circuit 220 may store, in the random sampling register 320, the random sampling address(es) RS_ADDR accessed at random sampling time points set by the randomizer 310 during the second row hammer monitoring time frame tREFi.

In operation S830, the control logic circuit 220 may determine the similarity of the access pattern between the random sampling address(es) RS_ADDR obtained in operation S822 and the row hammer address(es) RH_ADDR obtained in operation S821. The control logic circuit 220 may detect malicious row hammer address(es) MH_ADDR accessed at random sampling time points during the second row hammer monitoring time frame tREFi and being accessed with the number of accesses equal to or more than the predetermined number of times or a relatively higher number of accesses as compared with other addresses during the first row hammer monitoring time frame tREFw.

After obtaining the row hammer address(es) RH_ADDR and malicious row hammer address(es) MH_ADDR in operations S821, S822, and S830, the control logic circuit 220 may proceed to operations S840 and S860.

In operation S840, the control logic circuit 220 may determine whether the second row hammer monitoring time frame tREFi has elapsed. If the second row hammer monitoring time frame tREFi has not elapsed (NO), the control logic circuit 220 may proceed to operations S821 and S822. The control logic circuit 220 may repeatedly perform the row hammer monitoring operation on the row hammer address(es) RH_ADDR and the malicious row hammer address(es) MH_ADDR to be obtained in operations S821, S822, and S830. When the second row hammer monitoring time frame tREFi has elapsed (YES), it may proceed to operation S850.

If the control logic circuit 220 is determined that there is no similarity of the access pattern between the random sampling address(es) RS_ADDR and the row hammer address(es) RH_ADDR (NO), in operation S850, the control logic circuit 220 may perform a target refresh operation on the row hammer address(es) RH_ADDR obtained in operation S821. After performing the target refresh operation S850, the control logic circuit 220 may proceed to operation S870.

If the control logic circuit 220 is determined that there is similarity of the access pattern between the random sampling address(es) RS_ADDR and the row hammer address(es) RH_ADDR (YES), in operation S860, the control logic circuit 220 may transmit information on the malicious row hammer address(es) MH_ADDR to the memory controller 112 to inform the malicious row hammer. The control logic circuit 220 notifies the memory controller 112 by transmitting a malicious row hammer (e.g., the malicious row hammer address(es) MH_ADDR) in operation S860, and may proceed to operation S870. Also, in operation S860, the control logic circuit 220 may perform a target refresh operation on the malicious row hammer address(es) MH_ADDR obtained in operation S821, S822, and S830.

In operation S870, the control logic circuit 220 may determine whether the first row hammer monitoring time frame tREFw has elapsed. If the first row hammer monitoring time frame tREFw has not elapsed (NO), the control logic circuit 220 may proceed to operations S821 and S822. The control logic circuit 220 may repeatedly perform the row hammer monitoring operation on the row hammer address(es) RH_ADDR and the malicious row hammer address(es) MH_ADDR to be obtained in operations S821, S822, and S830. When the first row hammer monitoring time frame tREFw has elapsed (YES), the control logic circuit 220 may proceed to operation S810 to initialize the memory device 120. In this case, the first count value CT1 of the row access counter 330 and the second count value CT2 of the similarity counter circuit 360 may be reset to "0".

Figure 9:
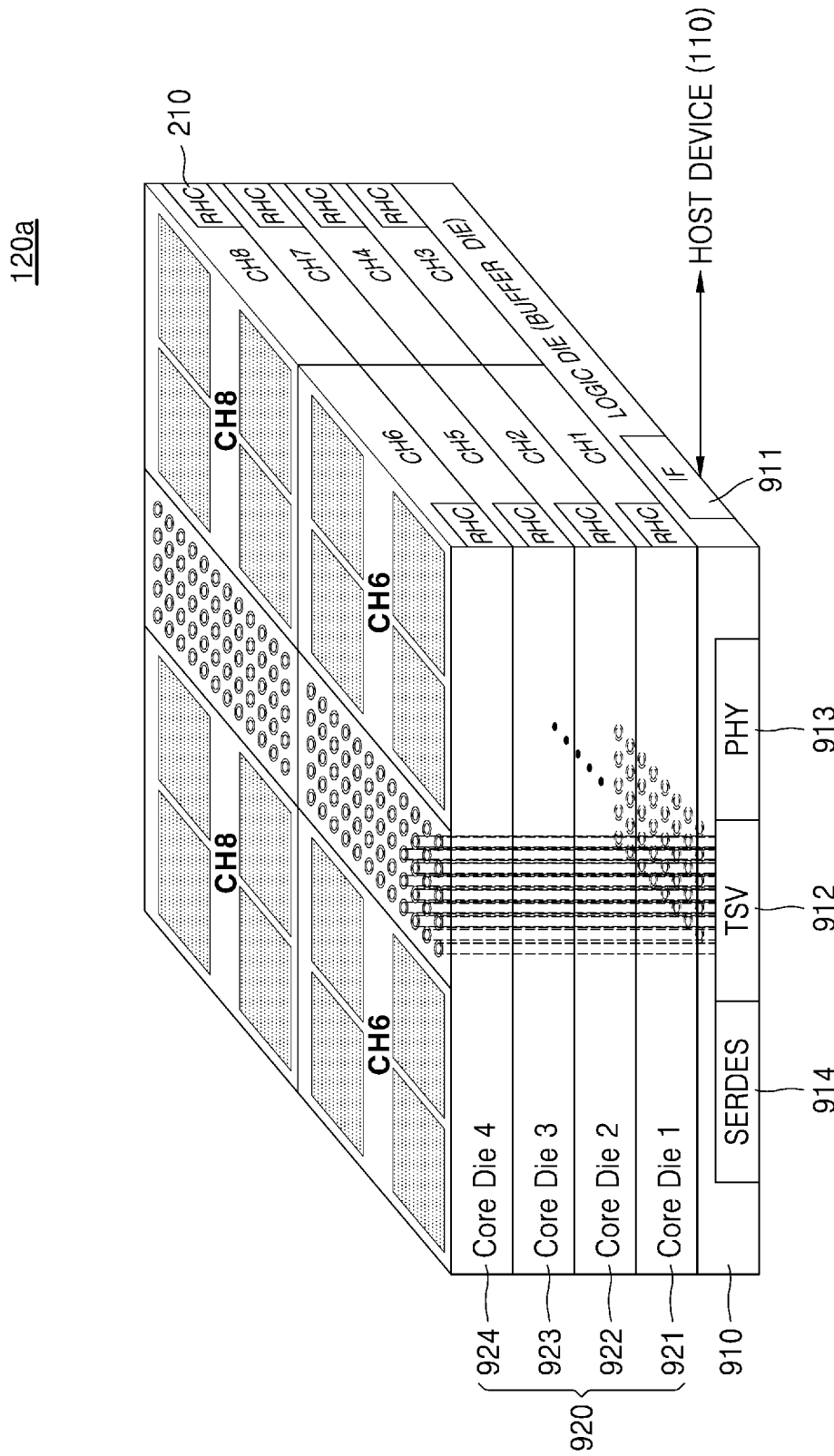
FIG. 9 is a view for explaining a memory device for controlling row hammer according to an example embodiment of the inventive concept.

FIG. 9 is a view for explaining a memory device for controlling row hammer according to an example embodiment of the inventive concept. FIG. 9 shows the memory device 120 of FIG. 1 implemented with HBM. It should be noted that the HBM configuration shown in FIG. 9 is provided as an example and is not necessarily an actual HBM configuration. Furthermore, the present disclosure is not limited to the HBM configuration shown in FIG. 9 as an example. Hereinafter, subscripts (e.g., "a" in 120a) attached to the same reference numbers in different drawings are used to distinguish a plurality of circuits having similar or identical functions. For convenience of description, a memory device 120a may be used interchangeably with a HBM 120a.

Referring to FIGS. 1 and 9, the HBM 120a may be connected to the host device 110 through the JEDEC standard HBM protocol. The HBM protocol is a high-performance random access memory (RAM) interface for three-dimensional stacked memories (e.g., DRAM). The HBM 120a generally achieves a wider bandwidth, while consuming less power, in a substantially smaller form factor than other DRAM technologies (e.g., DDR4, GDDR5, etc.).

The HBM 120a may have a high bandwidth by including a plurality of channels CH1 to CH8 having an interface independent from each other. The HBM 120a may include a plurality of dies 910 and 920, and, for example, may include a logic die (or buffer die) 910 and one or more core dies 920 stacked on the logic die 910. In the example of FIG. 9, although the example in which first to fourth core dies 921 to 924 are provided in the HBM 120a is illustrated, the number of core dies 920 may be variously changed. The core dies 920 may be referred to as memory dies.

Each of the first to fourth core dies 921 to 924 may include one or more channels. In FIG. 9, as each of the first to fourth core dies 921 to 924 includes two channels, an example in which the HBM 120a has eight channels CH1 to CH8 is illustrated. For example, the first core die 921 may include a first channel CH1 and a third channel CH3, the second core die 922 may include a second channel CH2 and a fourth channel CH4, the third core die 923 may include a fifth channel CH5 and a seventh channel CH7, and the fourth core die 924 may include a sixth channel CH6 and an eighth channel CH8.

The logic die 910 may include an interface circuit 911 communicating with the host device 110, and may receive commands/addresses and data from the host device 110 through the interface circuit 911. The host device 110 may transmit a command/address and data through the bus(es) 130 arranged to correspond to the channel(s) CH1 to CH8, and may be formed such that the bus 130 is divided for each channel, or some of the buses 130 may be shared by at least two channels. The interface circuit 911 may transmit a command/address and data to a channel through which the host device 110 requests a memory operation or arithmetic processing. Further, according to an example embodiment of the inventive concept, each of the core dies 920 may include a processor-in-memory (PIM) circuit or the channels CH1 to CH8 may be communicated with respective PIM circuits.

The host device 110 may provide a command/address and data so that at least some of a plurality of arithmetic tasks or kernels may be performed in the HBM 120a, and arithmetic processing may be performed in a PIM circuit of a channel designated by the host device 110. As an example, when the received command/address indicates arithmetic processing, the PIM circuit of the corresponding channel may perform arithmetic processing using write data provided from the host device 110 and/or data read from the corresponding channel. As another example, when a command/address received through a corresponding channel of the HBM 120a indicates a memory operation, an access operation for data may be performed.

According to an embodiment, a plurality of banks may be prepared for each of the channels CH1 to CH8, and one or more processing elements may be provided in a PIM circuit of each channel. As an example, the number of processing elements in each channel may be equal to the number of banks, or one processing element may be shared by at least two banks as the number of processing elements is less than the number of banks. The PIM circuit of each channel may execute a kernel offloaded by the host device 110.

According to an embodiment, the row hammer control circuit described with reference to FIGS. 1 to 8 may be prepared for each of the channels CH1 to CH8. The row hammer control circuit for each of the channels CH1 to CH8 elementwise compares the row hammer address(es) RH_ADDR having the number of accesses equal to or more than the predetermined number of times or having a relatively higher number of accesses as compared with other access addresses during the first row hammer monitoring time frame tREFw with the random sampling address(es) RS_ADDR accessed at random sampling time points during the second row hammer monitoring time frame tREFi, and as a result of the comparison, notifies the memory controller 112 of the malicious row hammer address(es) MH_ADDR determined to be identical, and causes a target refresh to the malicious row hammer address(es) MH_ADDR to be performed to alleviate the row hammer of the channels CH1 to CH8.

Meanwhile, the logic die 910 may further include a through silicon via (TSV) region 912, an HBM physical layer interface (HBM PHY) region 913, and a serializer/deserializer (SERDES) region 914. The TSV region 912 is a region in which a TSV for communication with the core dies 920 is formed, and is a region in which the bus(es) 130 arranged corresponding to the channel(s) CH1 to CH8 are formed. When each of the channels CH1 to CH8 has a bandwidth of 128 bits, the TSVs may include configurations for data input/output of 1024 bits.

The HBM PHY region 913 may include a plurality of input/output circuits for communication with the memory controller 112 and the channels CH1 to CH8, and for example, the HBM PHY region 913 may include one or more interconnect circuits for connecting the memory controller 112 to the channels CH1 to CH8. The HBM PHY region 913 may include physical or electrical layers and logical layers provided for signals, frequency, timing, driving, detailed operating parameters and functionality required for efficient communication between the memory controller 112 and the channels CH1 to CH8. The HBM PHY region 913 may perform memory interfacing such as selecting a row and column corresponding to a memory cell for a corresponding channel, writing data to the memory cell, or reading the written data. The HBM PHY region 913 may support features of the HBM protocol of the JEDEC standard.

As the processing throughput of the processor(s) 112 of the host device 110 increases, and as the demands on memory bandwidth increase, the SERDES region 914 is a region providing a SERDES interface of the JEDEC standard. The SERDES region 914 may include a SERDES transmitter portion, a SERDES receiver portion, and a controller portion. The SERDES transmitter portion includes a parallel-to-serial circuit and a transmitter, and is capable of receiving a parallel data stream and serializing the received parallel data stream. The SERDES receiver portion includes a receiver amplifier, an equalizer, a clock and data recovery circuit, and a serial-to-parallel circuit, and may receive the serial data stream and parallelize the received serial data stream. The controller portion may include an error detection circuit, an error correction circuit, and a register such as First In First Out (FIFO).

Figure 10:
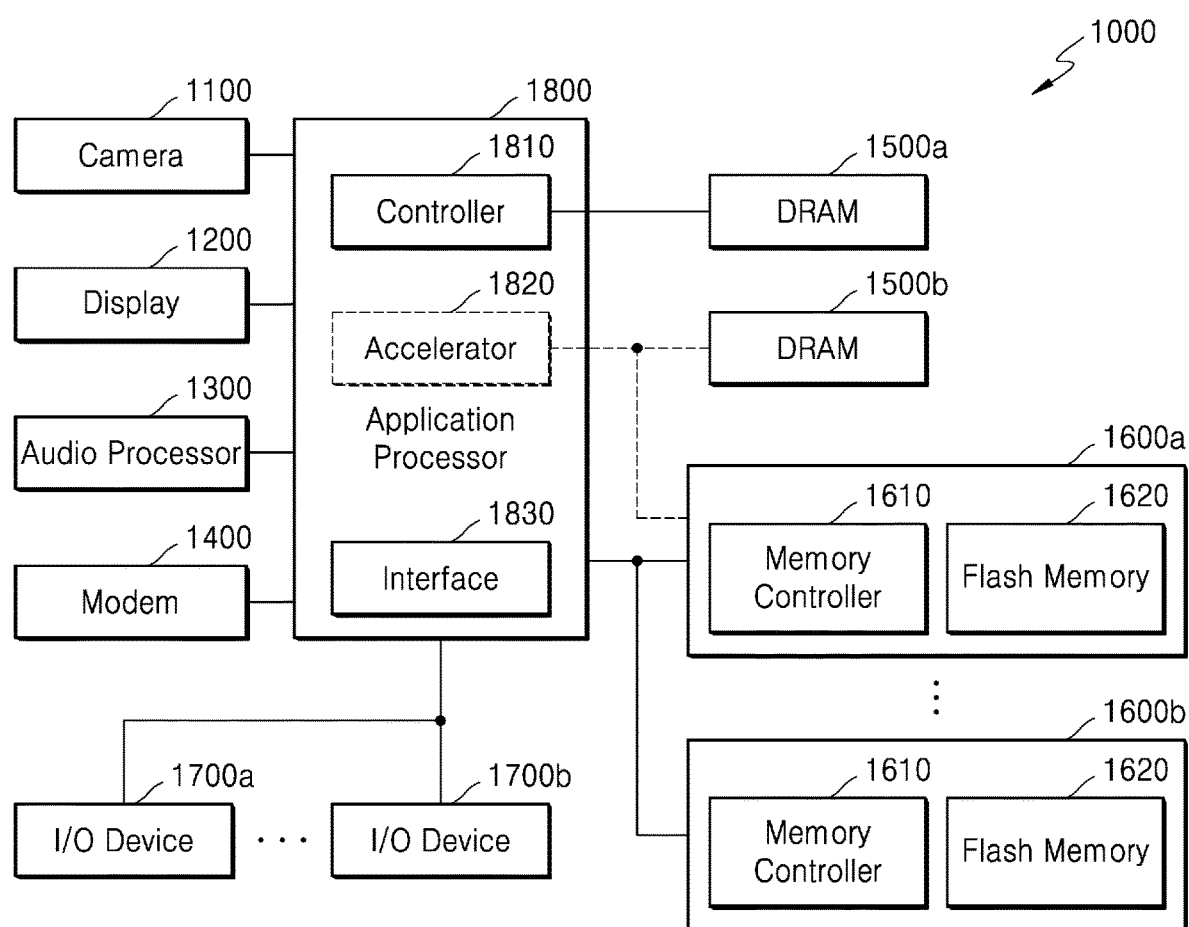
FIG. 10 is a block diagram illustrating a system including a memory device for controlling row hammer according to embodiments of the inventive concept.

FIG. 10 is a block diagram illustrating a system 1000 including a memory device for controlling row hammer according to embodiments of the inventive concept.

Referring to FIG. 10, the system 1000 may include a camera 1100, a display 1200, an audio processor 1300, a modem 1400, DRAMs 1500a and 1500b, flash memories 1600a and 1600b, I/O devices 1700a and 1700b, and an application processor AP 1800. The system 1000 may be implemented as a laptop computer, a mobile phone, a smartphone, a tablet personal computer, a wearable device, a healthcare device, or an Internet of Things (IoT) device. In addition, the system 1000 may be implemented as a server or a personal computer.

The camera 1100 may take a still image or a moving picture according to a user's control, and may store the captured image/video data or transmit the stored captured image/video data to the display 1200. The audio processor 1300 may process audio data included in content of the flash memory devices 1600a and 1600b or a network. The modem 1400 modulates and transmits a signal to transmit/receive wired/wireless data, and may demodulate the modulated signal to restore the original signal at the receiving end. The I/O devices 1700a and 1700b may include devices that provide digital input and/or output functionality such as a Universal Serial Bus (USB) or storage, a digital camera, a Secure Digital (SD) card, a Digital Versatile Disc (DVD), a network adapter, a touch screen, and the like.

The AP 1800 may control the overall operation of the system 1000. The AP 1800 may control the display 1200 so that a part of the content stored in the flash memories 1600a and 1600b is displayed on the display 1200. When a user input is received through the I/O devices 1700a and 1700b, the AP 1800 may perform a control operation corresponding to the user input. The AP 1800 may include an accelerator block, which is a dedicated circuit for artificial intelligence (AI) data operation, or may include an accelerator chip 1820 separately from the AP 1800. DRAM 1500b may be additionally mounted to the accelerator block or the accelerator chip 1820. The accelerator is a function block that professionally performs a particular function of the AP 1800, and may include a GPU that is a function block that specializes in processing graphics data, a Neural Processing Unit (NPU) that is a block for professionally performing AI calculations and inference, and a Data Processing Unit (DPU) that is a block for specializing in data transfer.

The system 1000 may include DRAMs 1500a and 1500b. The AP 1800 may control the DRAMs 1500a and 1500b through the command and mode register (MRS) setting that meets the JEDEC standard, and communicate by setting the DRAM interface protocol to use company-particular functions such as low voltage/high speed/reliability and Cyclic Redundancy Check (CRC)/Error Correction Code (ECC) functions. For example, the AP 1800 may communicate with the DRAM 1500a through an interface conforming to JEDEC standards such as LPDDR4 and LPDDR5. and the accelerator block or the accelerator chip 1820 may communicate by setting a new DRAM interface protocol to control the DRAM 1500b, which is accelerator DRAM having a higher bandwidth than the DRAM 1500a.

Although only the DRAMs 1500a and 1500b are illustrated in FIG. 10, the inventive concept is not limited thereto, and if the AP 1800 or the accelerator chip 1820 bandwidth, reaction speed, and voltage conditions are satisfied, any memory, such as a phase-change RAM (PRAM), a static RAM (SRAM), a magnetic RAM (MRAM), a resistive RAM (RRAM), a ferroelectric RAM (FRAM), or Hybrid RAM, may be used. The DRAMs 1500a and 1500b have relatively smaller latency and bandwidth than the I/O devices 1700a and 1700b or the flash memories 1600a and 1600b. The DRAMs 1500a and 1500b may be initialized at the power-on time point of the system 1000, and may be used as a temporary storage location for the operating system and application data loaded with the operating system and application data, or may be used as an execution space for various software code.

In the DRAMs 1500a and 1500b, addition/subtraction/multiplication/division operations, vector operations, address operations, or Fast Fourier Transform (FFT) operations may be performed. In addition, a function used for inference may be performed in the DRAMs 1500a and 1500b. Here, the inference may be performed in a deep learning algorithm using an artificial neural network. The deep learning algorithm may include a training operation of learning a model through various data and an inference operation of recognizing data with the learned model. As an embodiment, the image captured by the user through the camera 1100 is signal-processed and stored in the DRAM 1500b, and the accelerator block or the accelerator chip 1820 may perform an AI data operation for recognizing data using data stored in the DRAM 1500b and a function used for inference.

The system 1000 may include a plurality of storage or the flash memories 1600a and 1600b having a larger capacity than the DRAMs 1500a and 1500b. The accelerator block or the accelerator chip 1820 may perform a training operation and AI data operation by using the flash memories 1600a and 1600b. In an embodiment, the flash memories 1600a and 1600b may more efficiently perform a training operation and an inference AI data operation performed by the AP 1800 and/or the accelerator chip 1820 using the arithmetic device provided in the memory controller 1610. The flash memories 1600a and 1600b may store pictures taken through the camera 1100 or data transmitted through a data network. For example, augmented reality/virtual reality, High Definition (HD), or Ultra High Definition (UHD) content may be stored.

In system 1000, each of the DRAMs 1500a and 1500b may include the row hammer control circuit described with reference to FIGS. 1 to 8. Each of the DRAMs 1500a and 1500b elementwise compares the row hammer address(es) RH_ADDR having the number of accesses equal to or more than the predetermined number of times or having a relatively higher number of accesses as compared with other access addresses during the first row hammer monitoring time frame tREFw to the random sampling address(es) RS_ADDR accessed at random sampling time points during the second row hammer monitoring time frame tREFi, and as a result of the comparison, notifies the controller 1810 of the malicious row hammer address(es) MH_ADDR determined to be identical, and causes a target refresh to the malicious row hammer address(es) MH_ADDR to be performed to alleviate the row hammer of the DRAMs 1500a and 1500b.

While the inventive concept has been particularly shown and described with reference to embodiments thereof, it will be understood that various changes in form and details may be made therein without departing from the spirit and scope of the following claims.

What is claimed is:
1. A memory device comprising:
a memory cell array including a plurality of memory cell rows;
a control logic circuit configured to detect:
a row hammer address of memory cell rows having a number of accesses equal to or more than a predetermined number of times or having a relatively higher number of accesses as compared with other access addresses during a first row hammer monitoring time frame, and
a malicious row hammer address of memory cell rows accessed at random sampling time points during a second row hammer monitoring time frame, the malicious row hammer address being the same as the row hammer address; and
a refresh control circuit configured to refresh a memory cell row physically adjacent to a memory cell row corresponding to the row hammer address,
wherein the control logic circuit comprises:
a randomizer including a linear feedback shift register configured to output a plurality of bits and set the random sampling time points by using the output bits of the linear feedback shift register during the second row hammer monitoring time frame;
a first register configured to store random sampling addresses of memory cell rows accessed at the random sampling time points;
a comparator configured to compare the row hammer address with the random sampling addresses, and output the row hammer address as the malicious row hammer address when one of the random sampling addresses is identical to the row hammer address based on a result of the comparison; and
a similarity counter circuit configured to count a number of malicious row hammer addresses,
wherein the refresh control circuit is configured to refresh a memory cell row physically adjacent to a memory cell row corresponding to the malicious row hammer address when the counted number of malicious row hammer addresses exceeds a threshold value, and
wherein the first and second row hammer monitoring time frames are set to be identical to or different from each other.

2. The memory device of claim 1, wherein the control logic circuit is configured to use a refresh window tREFw set in the memory device as the first and second row hammer monitoring time frames.

3. The memory device of claim 1, wherein the first row hammer monitoring time frame is set longer than the second row hammer monitoring time frame.

4. The memory device of claim 1, wherein the control logic circuit is configured to use a refresh time interval tREFi set in the memory device as the second row hammer monitoring time frame.

5. The memory device of claim 1, wherein the control logic circuit is configured to use a refresh window tREFw set in the memory device as the first row hammer monitoring time frame.

6. A memory device comprising:
a memory cell array including a plurality of memory cell rows;
a control logic circuit configured to detect:
a row hammer address of memory cell rows having a number of accesses equal to or more than a predetermined number of times or having a relatively higher number of accesses as compared with other access addresses during a first row hammer monitoring time frame, and
a malicious row hammer address of memory cell rows accessed at random sampling time points during a second row hammer monitoring time frame, the malicious row hammer address being the same as the row hammer address; and
a refresh control circuit configured to refresh a memory cell row physically adjacent to a memory cell row corresponding to the row hammer address,
wherein the control logic circuit comprises:
a first counter configured to store first count values counting the number of accesses of addresses accessed during the first row hammer monitoring time frame;
a first register configured to store random sampling addresses of memory cell rows accessed at the random sampling time points;
a second register configured to select, among the first count values, particular count values equal to or more than the predetermined number of times or relatively higher count values as compared with other the first count values, and store addresses corresponding to the selected particular count values or the relatively higher count values as the row hammer address;
a comparator configured to compare the row hammer address with the random sampling addresses, and output the row hammer address as the malicious row hammer address when one of the random sampling addresses is identical to the row hammer address based on a result of the comparison; and
a similarity counter circuit configured to count a number of malicious row hammer addresses,
wherein the refresh control circuit is configured to refresh a memory cell row physically adjacent to a memory cell row corresponding to the malicious row hammer address when the counted number of malicious row hammer addresses exceeds a threshold value, and
wherein the control logic circuit is configured to reset the first count values after the first row hammer monitoring time frame elapses.

7. The memory device of claim 6, wherein the control logic circuit further comprises a second counter configured to store a second count value of counting the number of malicious row hammer addresses, and
wherein the control logic circuit is configured to notify a memory controller of information on the malicious row hammer address when the second count value exceeds the threshold value.

8. The memory device of claim 7, wherein the control logic circuit is configured to reset the second count value after the second row hammer monitoring time frame elapses.

9. A method of operating a memory device including a plurality of memory cell rows, the method comprising:
detecting a first hammer address and a second hammer address by monitoring the number of accesses of addresses for the memory cell rows;
storing the first hammer address as a row hammer address of memory cell rows having the number of accesses equal to or more than a predetermined number of times or having a relatively higher number of accesses as compared with other access addresses during a first row hammer monitoring time frame;
storing the second hammer address as a malicious row hammer address of memory cell rows accessed at random sampling time points during a second row hammer monitoring time frame, the malicious row hammer address being same as the row hammer address;
counting the number of malicious row hammer addresses;
performing a refresh operation on a memory cell row physically adjacent to a memory cell row corresponding to the row hammer address; and
performing a refresh operation on a memory cell row physically adjacent to a memory cell row corresponding to the malicious row hammer address when the counted number of malicious row hammer addresses exceeds a threshold value,
wherein the first and second row hammer monitoring time frames are set to be identical to or different from each other.

10. The method of claim 9, wherein each of the first and second row hammer monitoring time frames is set to a refresh window tREFw set in the memory device.

11. The method of claim 9, wherein the first row hammer monitoring time frame is set longer than the first row hammer monitoring time frame.

12. The method of claim 9, wherein the second row hammer monitoring time frame is set to a refresh time interval tREFi set in the memory device.

13. The method of claim 9, wherein the first row hammer monitoring time frame is set to a refresh window tREFw set in the memory device.

14. The method of claim 9, further comprising:
storing first count values for counting the number of accesses of addresses accessed during the first row hammer monitoring time frame;
selecting particular count values equal to or more than the predetermined number of times or relatively higher count values as compared with other the first count values;
providing an address corresponding to the selected particular count values or the relatively higher count values as the row hammer address; and
resetting the first count values after the first row hammer monitoring time frame elapses.

15. The method of claim 9, further comprising:
providing the random sampling time points during the second row hammer monitoring time frame using a randomizer; and
storing addresses as a random sampling address accessed at the random sampling time points.

16. The method of claim 15, wherein the providing of the random sampling time points is set by output bits of a linear feedback shift register.

17. The method of claim 15, further comprising:
comparing the row hammer address to the random sampling address;
storing a second count value obtained by counting the number of malicious row hammer addresses as a result of the comparison; and
notifying an external device of information on the malicious row hammer address when the second count value exceeds the threshold value.

18. The method of claim 17, further comprising resetting the second count value after the second row hammer monitoring time frame elapses.

\* \* \* \* \*